(12) United States Patent
Hou

(10) Patent No.: US 11,264,438 B2
(45) Date of Patent: Mar. 1, 2022

(54) OLED DISPLAY SUBSTRATE, DISPLAY DEVICE AND MANUFACTURING METHOD THEREOF

(71) Applicant: BOE TECHNOLOGY GROUP CO., LTD., Beijing (CN)

(72) Inventor: Wenjun Hou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 278 days.

(21) Appl. No.: 16/493,267

(22) PCT Filed: Apr. 9, 2019

(86) PCT No.: PCT/CN2019/081922
§ 371 (c)(1),
(2) Date: Sep. 11, 2019

(87) PCT Pub. No.: WO2020/057108
PCT Pub. Date: Mar. 26, 2020

(65) Prior Publication Data
US 2021/0335932 A1    Oct. 28, 2021

(30) Foreign Application Priority Data

Sep. 21, 2018  (CN) .......................... 201811116903.0

(51) Int. Cl.
*H01L 27/32* (2006.01)
*H01L 51/56* (2006.01)
(52) U.S. Cl.
CPC .......... *H01L 27/3246* (2013.01); *H01L 51/56* (2013.01); *H01L 2227/323* (2013.01)

(58) Field of Classification Search
None
See application file for complete search history.

(56) References Cited

U.S. PATENT DOCUMENTS

2014/0183471 A1* 7/2014 Heo ...................... H01L 51/504
                                                            257/40
2017/0005150 A1* 1/2017 Yeo ...................... H01L 51/5237

FOREIGN PATENT DOCUMENTS

CN    1232292 A    10/1999
CN    1667477 A    9/2005
(Continued)

OTHER PUBLICATIONS

International Search Report in Application No. PCT/CN2019/081922, dated Jul. 11, 2019.
(Continued)

*Primary Examiner* — Michelle Mandala
(74) *Attorney, Agent, or Firm* — Syncoda LLC; Feng Ma

(57) ABSTRACT

An organic light-emitting diode (OLED) display panel includes: a base substrate; one or more thin-film transistor (TFT) structures provided over the base substrate; a planarization layer provided over the TFT structures; anodes provided on an upper surface of the planarization layer; a pixel defining layer provided over the planarization layer defining a plurality of pixel regions, wherein each anode includes an upper surface being exposed in each of the pixel regions; an organic functional layer provided over the anodes; and a cathode provided over the organic functional layer; wherein a sheet resistance of the portion of the anodes that is proximal to the pixel defining layer is smaller than a sheet resistance of the portion of the anodes that is opposite from the pixel defining layer.

18 Claims, 18 Drawing Sheets

(56) References Cited

FOREIGN PATENT DOCUMENTS

| | | |
|---|---|---|
| CN | 1707340 A | 12/2005 |
| CN | 105097868 A | 11/2015 |
| KR | 101776039 B1 | 9/2017 |

OTHER PUBLICATIONS

CN First Office Action in Application No. 201811116903.0, dated Apr. 20, 2020.
CN Second Office Action in Application No. 201811116903.0, dated Dec. 4, 2020.
CN Third Office Action in Application No. 201811116903.0, dated Apr. 8, 2021.

\* cited by examiner forming a second trench in a region of the anode layer opposite the pixel defining layer, the second trench having a depth smaller than a depth of the anode layer, and the remaining anode layer being left as a first anode

↓ forming a second anode in the second trench, wherein the square resistance of the second anode is greater than the square resistance of the first anode

FIG. 5

OLED DISPLAY SUBSTRATE, DISPLAY DEVICE AND MANUFACTURING METHOD THEREOF

CROSS-REFERENCE TO RELATED APPLICATION

The present application claims priority to Chinese Patent Application No. 201811116903.0 filed on Sep. 21, 2018, the disclosure of which is hereby incorporated by reference in its entirety.

TECHNICAL FIELD

The present disclosure relates generally to the fields of display technologies, and more specifically to an OLED display substrate, a display device and manufacturing method thereof.

BACKGROUND

Compared with LCD (i.e., liquid crystal display) components, OLED (i.e., organic light-emitting diode) components have the advantages such as self-luminosity, faster response, wider viewing-angle, higher brightness level, brighter color, lightness and thinness, as such OLED technologies are widely regarded as being the next generation of display technologies.

Organic light-emitting component thin film deposition methods typically include vacuum evaporation and solution process. In ink-jet film deposition or printing processes, during in-pixel film forming process, ink may climb to a pixel defining layer, as a result, the thickness of the organic functional layer at the periphery region of a pixel may be larger than the thickness of the central region of a pixel.

SUMMARY

In a first aspect, an organic light-emitting diode (OLED) display substrate is provided, including:
 a base substrate;
 one or more thin-film transistor (TFT) structures provided over the base substrate;
 a planarization layer provided over the TFT structures;
 anodes provided on an upper surface of the planarization layer;
 a pixel defining layer provided over the planarization layer defining a plurality of pixel regions, wherein each anode includes an upper surface being exposed in each of the pixel regions;
 an organic functional layer provided over the anodes; and
 a cathode provided over the organic functional layer;
 wherein a sheet resistance of the portion of the anodes that is proximal to the pixel defining layer is smaller than a sheet resistance of the portion of the anodes that is opposite from the pixel defining layer.

In some embodiments, each pixel region further includes:
 a central region that is proximal to the pixel defining layer and a peripheral region that is opposite from the pixel defining layer;
 a first anode provided in the peripheral layer; and
 a second anode provided in the central region, wherein, the sheet resistance of the second anode is larger than the sheet resistance of the first anode.

In some embodiments, each pixel region further includes:
 a central region that is proximal to the pixel defining layer and a peripheral region that is opposite from the pixel defining layer;
 a first anode provided in the pixel region;
 a second groove provided at the central region of the first anode; wherein the depth of the second groove is smaller than the thickness of the first anode; and
 a second anode provided inside the second groove, wherein, the sheet resistance of the second anode is larger than the sheet resistance of the first anode.

In some embodiments, each pixel region further includes:
 a central region that is proximal to the pixel defining layer and a peripheral region that is opposite from the pixel defining layer;
 a first anode provided in the pixel region;
 a first groove that passes through the portion of the first anode that is in the central region;
 a third anode provided inside the first groove, the thicknesses of the third anode being smaller than the thicknesses of the first anode; and
 a second anode provided inside the first groove, the second anode is located at the side of the third anode that is proximal to the organic functional layer, wherein, the sheet resistance of the second anode is larger than the sheet resistance of the first anode and the sheet resistance of the third anode.

In some embodiments, the sheet resistance of a second anode is greater than the sheet resistance of a first anode which is greater than the sheet resistance of a third anode.

In some embodiments, wherein the first anode is formed about a circumferential portion of the second anode.

In some embodiments, the first anode as bars being provided opposing edges of the second anode.

In another aspect, a manufacturing method of an OLED display substrate is provided, the method including:
 providing a base substrate:
 forming a plurality of TFT structures over the base substrate;
 forming a planarization layer over the TFT structures;
 forming an anode layer having one or more anodes provided therein on the planarization layer;
 forming a pixel defining layer which surrounds the one or more anodes within the anode layer over the planarization layer;
 wherein the sheet resistance of a portion of the anode layer that is adjacent to the pixel defining layer is smaller than the sheet resistance of the portion of the anode layer that is opposite from the pixel defining layer;
 forming an organic functional layer over the anode layer; and
 forming one or more cathodes over the organic functional layer.

In some embodiments, each pixel region further includes a central region that is proximal to the pixel defining layer and a peripheral region that is opposite from the pixel defining layer;
 wherein for each pixel region, in a region that is adjacent to the side of the organic functional layer, wherein the sheet resistance of a portion of the anode layer that is adjacent to the pixel defining layer is smaller than the sheet resistance of a portion of the anode layer that is opposite from the pixel defining layer; and wherein the method further includes:
 forming a first groove that passes through the anode layer in a central region of the anode layer being opposite from the pixel defining layer such that the planarization layer is exposed, wherein the remaining anode layer thus defines a first anode; and forming a second anode in the first groove, wherein the sheet resistance of the second anode is larger than the sheet resistance of the first anode.

In some embodiments, each pixel region further includes a central region that is proximal to the pixel defining layer and a peripheral region that is opposite from the pixel defining layer;

wherein for each pixel region, the anode layer is located in a region that is adjacent to the side of the organic functional layer, wherein the sheet resistance of a portion of the anode layer that is adjacent to the pixel defining layer is smaller than the sheet resistance of a portion of the anode layer that is opposite from the pixel defining layer; and wherein the method further includes:

forming a second groove at the region of the anode layer that is opposite from the pixel defining layer, wherein the depth of the second groove is smaller than the thickness of the anode layer, wherein the remaining anode layer is a first anode; and forming a second anode in the second groove, wherein the sheet resistance of the second anode is larger than the sheet resistance of the first anode.

In some embodiments, each pixel region further includes a central region that is proximal to the pixel defining layer and a peripheral region that is opposite from the pixel defining layer;

wherein for each pixel region, the anode layer is located in a region that is adjacent to the side of the organic functional layer;

wherein the sheet resistance of a portion of the anode layer that is proximal to the pixel defining layer is smaller than the sheet resistance of a portion of the anode layer that is opposite from the pixel defining layer; and the method further includes:

forming a first groove that passes through the anode layer at the region of the anode layer that is opposite from the pixel defining layer such that the planarization layer is exposed, the remaining anode layer is a first anode;

forming a third anode in the first groove, the thickness of the third anode is smaller than the thickness of the first anode;

forming a second anode in the first groove at the side of the third anode that is proximal to the organic functional layer, wherein the sheet resistance of the second anode is larger than the sheet resistance of the first anode and the sheet resistance of the third anode.

In some embodiments, the sheet resistance of a second anode is greater than the sheet resistance of a first anode; and wherein the sheet resistance of the first anode is greater than the sheet resistance of a third anode.

In another aspect, an organic light-emitting diode (OLED) display panel is provided including:

a base substrate having an upper surface and a lower surface;

one or more thin-film transistor (TFT) structures provided on the upper surface of the base substrate;

a planarization layer provided over the TFT structures, the planarization layer having an upper surface and a lower surface, the lower surface of the planarization layer facing the upper surface of the base substrate;

a plurality of first anodes provided on the upper surface of the planarization layer;

a groove provided between at least two of the plurality of first anodes;

one or more second anodes provided within the groove;

a pixel defining layer provided over the planarization layer and encompassing an edge portion of the one or more anodes leaving a portion of a top surface of each anode exposed;

an organic functional layer provided over the one or more anodes on the portion of the top surface of each anode exposed from the pixel defining layer; and one or more cathodes provided over the organic functional layer.

In some embodiments, the groove extends the full height of the one or more first anodes and exposes the planarization layer below the first anode from a top side thereof.

In some embodiments, the OLED display panel further includes a third anode also provided within the groove.

In some embodiments, a combined thickness of the second and third anode is equal to a thickness of the first anode.

In some embodiments, the third anode is below the second anode, and wherein an upper surface of the second anode is flush with an upper surface of the first anode.

In some embodiments, a combined thickness of the second and third anode is equal to a thickness of the first anode.

In some embodiments, the groove extends less than a full height of the one or more first anodes and wherein a portion of material forming the first anode completely covers the upper surface of the planarization layer below the first anode from a top side thereof.

In some embodiments, an upper surface of the second anode is flush with an upper surface of the first anode.

In some embodiments, the OLED display panel further includes a third anode also provided within the groove.

In some embodiments, the first anode is formed about a circumferential portion of the second anode.

In some embodiments, the first anode is formed at opposing edges of the second anode.

In another aspect, an OLED display device is provided, wherein the display device is provided as a smart device, a mobile phone, or a laptop computer, the display device including the OLED display panel.

BRIEF DESCRIPTION OF DRAWINGS

To more clearly illustrate some of the embodiments, the following is a brief description of the drawings.

The drawings in the following descriptions are only illustrative of some embodiments. For those of ordinary skill in the art, other drawings of other embodiments can become apparent based on these drawings.

FIG. 5 illustrates an exemplary flow chart of another alternative manufacturing method of anodes according to some other embodiments of the present disclosure;

DETAILED DESCRIPTION

Figure 1:
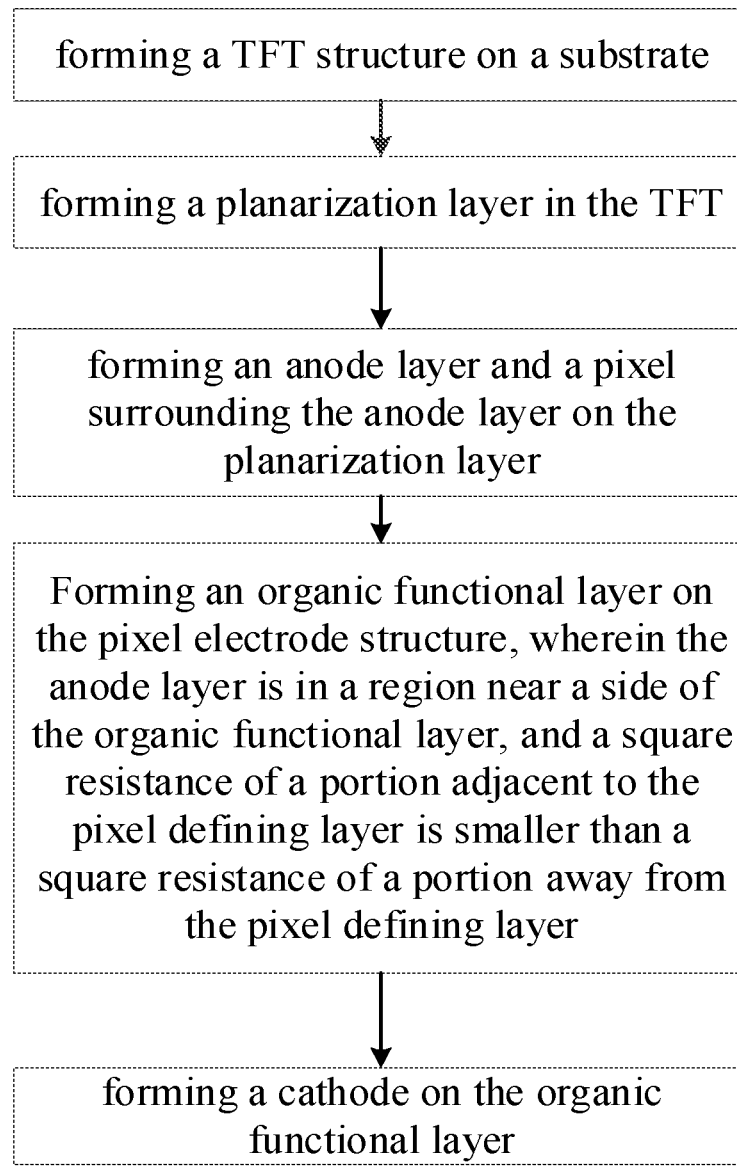
FIG. 1 illustrates a flow chart of a manufacturing method of an anode structure according to some embodiments of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or other structure is referred to as being "on" or extending "onto" another element, it can be directly on or extend directly onto the other element or intervening elements may also be present. In contrast, when an element is referred to as being "directly on" or extending "directly onto" another element, there are no intervening elements present.

Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "horizontal" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Various embodiments of the present disclosure provide an OLED display substrate, a display device and a manufacturing method thereof, such that the brightness uniformity of the display device can be ensured.

The inventors of the instant disclosure have recognized that, the thickness uniformity of the in-pixel film may directly influence the brightness uniformity of the light emitted by an OLED component, for example, when an OLED component is illuminated, the brightness level of the central region of a pixel is higher due to the reduced thickness, meanwhile the brightness level of the periphery region of a pixel is lower due to the increased thickness, thus the display brightness level will not be uniform.

During the manufacturing process of the OLED display substrate, when manufacturing the anodes, during the ink-jet printing process, when forming an in-pixel film, ink can climb to a pixel defining layer, as a result, the thickness of an organic functional layer at the periphery region of a pixel can be larger than the thickness of the central region of a pixel, the problem of nonuniform light emission in which the brightness level of the central region of a pixel is higher and the brightness level of the two sides of a pixel is lower can occur.

In order to solve the abovementioned problem, in present disclosure, hole injection can be adjusted through adjusting anode resistance value difference. In other words, according to the light-emitting principles of OLED components, the strength of the electric current flowing through anode determines the brightness level of a pixel, the stronger the electric current, the higher the brightness level, the brightness level can be adjusted by changing the strength of the electric current.

Referring to FIGS. 1-2, illustrated thereby is a flow chart and a process of a first manufacturing method of an OLED display substrate having a particular anode structure 50 according to first embodiments of the present disclosure being illustrative of various aspects of the present disclosure.

According to some embodiments of the present disclosure, a manufacturing method of an OLED display substrate is contemplated herein wherein the method can include the following steps: providing a base substrate 1; forming one or more thin-film transistor structures 2, hereinafter referred to as TFT structures 2, over the base substrate 1; forming a planarization layer 3 over the TFT structures 2; forming an anode layer 4 and a pixel defining layer 7 that surrounds the anode layer 4, wherein the anode layer 4 is located in the region proximal to the organic functional layer 8, the sheet resistance of the portion of the anode layer 4 that is proximal to the pixel defining layer is smaller than the sheet resistance of the portion of the anode layer 4 that is far away from the pixel defining layer; forming an organic functional layer 8 over the anode layer 4; and forming cathodes 9 over the organic functional layer 8.

In some embodiments, a manufacturing method of a first exemplary OLED display substrate is illustrated in FIG. 2A, FIG. 2B, FIG. 2C, FIG. 2D, FIG. 2E, FIG. 2F and FIG. 2G.

Figure 2A:
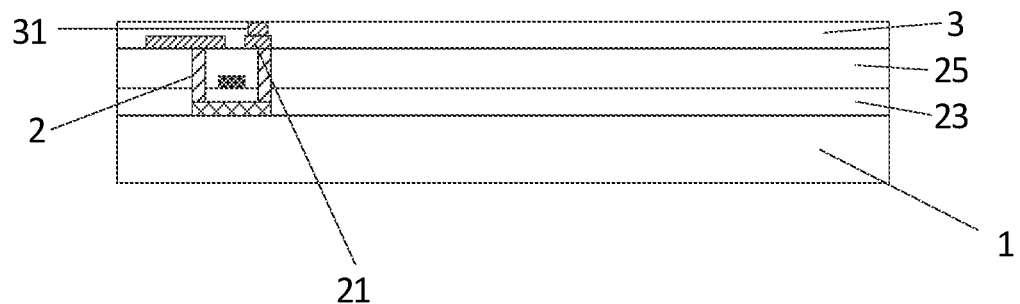
FIG. 2A illustrates an exemplary side cross-sectional view of a first sequential stage of the manufacturing process for creating an anode structure of FIG. 1 according to some embodiments of the present disclosure.

In particular, FIG. 2A illustrates a first sequential stage of manufacturing process for creating an anode structure. As particularly shown in FIG. 2A, the manufacturing method of the OLED display substrate that includes the inventive anode structure of the present disclosure can include: providing an OLED base substrate 1, forming TFT structures 2 over the base substrate 1, and forming a planarization layer 3 over the TFT structures 2.

As illustrated herein, one or more drain electrodes 21 can be provided to the TFT structures 2 which can be electrically connected to the anode layer 4 through one or more electrical contacts 31.

Figure 2B:
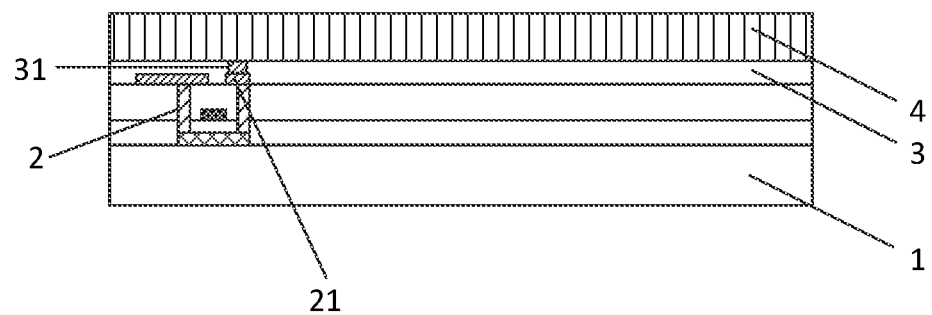
FIG. 2B illustrates an exemplary side cross-sectional view of a second sequential stage of the manufacturing process for creating an anode structure of FIG. 1 according to some embodiments of the present disclosure.

With particular reference to FIG. 2B, illustrated herein is a second sequential stage of manufacturing process for creating an anode structure, as shown in FIG. 2B, which includes forming an anode layer 4 over the planarization layer 3.

Figure 2C:
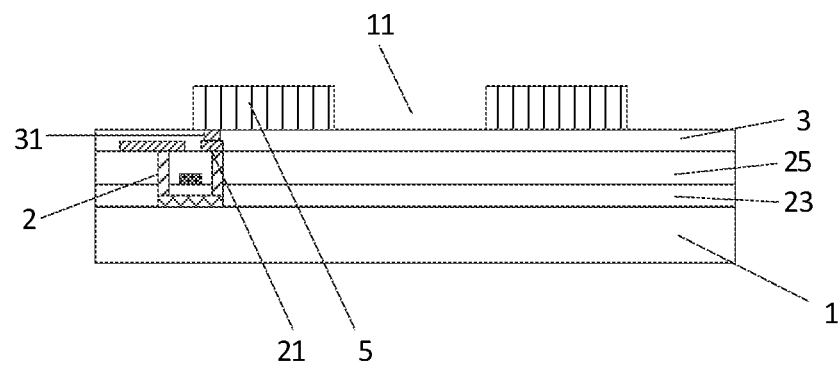
FIG. 2C illustrates an exemplary side cross-sectional view of a third sequential stage of the manufacturing process for creating an anode structure of FIG. 1 according to some embodiments of the present disclosure.

With particular reference to FIG. 2C, this figure illustrates a third sequential stage of manufacturing process for creating an anode structure, as shown in FIG. 2C, for each pixel region 54, the process can include a step of forming a first groove that passes through the anode layer 4 from an upper or opposing surface of the anode layer 4 from the pixel defining layer, extending through the anode layer 4 such that the planarization layer 3 is exposed. In this manner, portions of the anode layer 4 are left behind, wherein the remaining portions of the anode layer 4 then define a first anode 5.

It will be appreciated that a pixel region 54 can be defined as a horizontal bound area extending vertically upward and downward from exterior edge portions of a pair of opposing first anodes 5 having a second anode 6 therebetween.

Figure 2D:
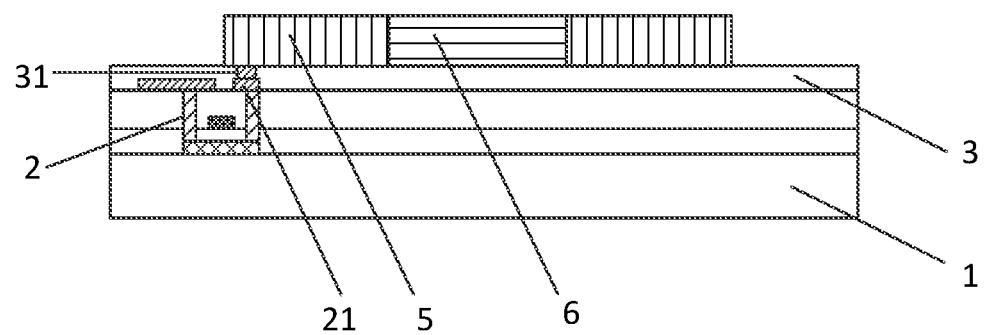
FIG. 2D illustrates an exemplary side cross-sectional view of a fourth sequential stage of the manufacturing process for creating an anode structure of FIG. 1 according to some embodiments of the present disclosure.

FIG. 2D illustrates a fourth sequential stage of manufacturing process for creating an anode structure 50, as shown in FIG. 2D. The process then includes a step of forming a second anode 6 in the first groove 11 for each pixel region 54. In some such embodiments, the sheet resistance of the second anode 6 can be larger than the sheet resistance of the first anode 5.

Figure 2E:
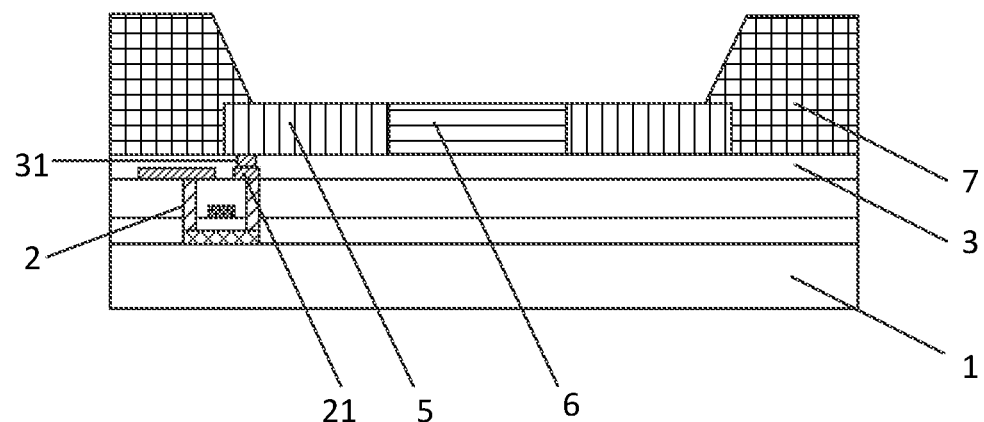
FIG. 2E illustrates an exemplary side cross-sectional view of a fifth sequential stage of the manufacturing process for creating an anode structure of FIG. 1 according to some embodiments of the present disclosure.

FIG. 2E illustrates a fifth sequential stage of manufacturing process for creating an anode structure, as shown in FIG. 2E, forming a pixel defining layer 7 that surrounds the anode layer 4.

Figure 2F:
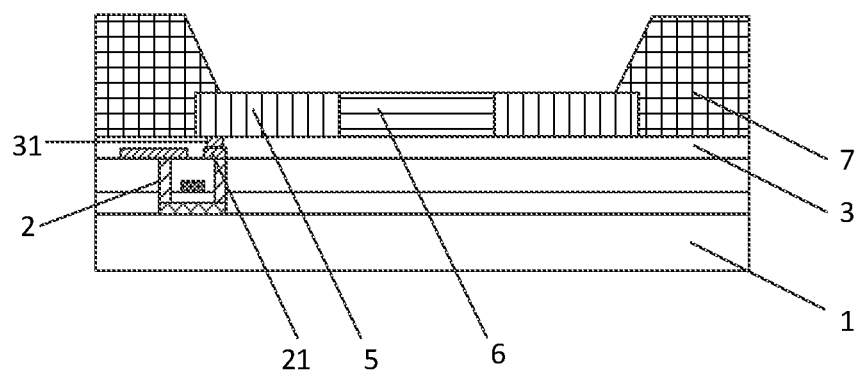
FIG. 2F illustrates an exemplary side cross-sectional view of a sixth sequential stage of manufacturing process for creating an anode structure of FIG. 1 according to some embodiments of the present disclosure.

FIG. 2F illustrates a sixth sequential stage of manufacturing process for creating an anode structure, as shown in FIG. 2F, forming an organic functional layer 8 over the anode layer 4.

Figure 2G:
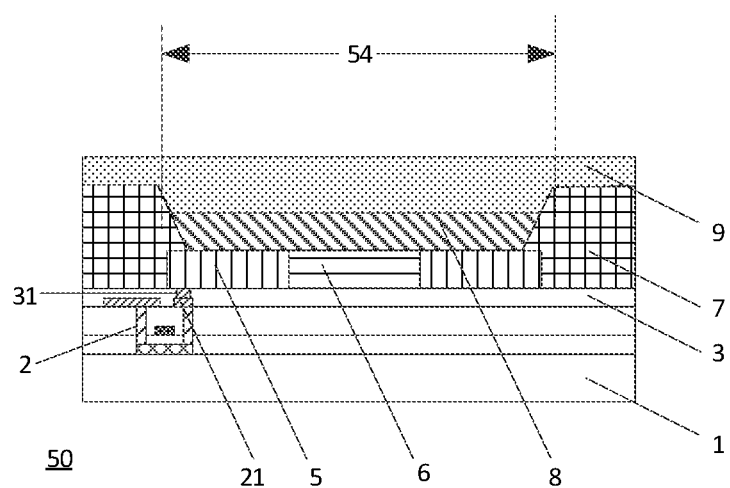
FIG. 2G illustrates an exemplary side cross-sectional view of a seventh sequential stage of manufacturing process for creating an anode structure of FIG. 1 according to some embodiments of the present disclosure.
Figure 3:
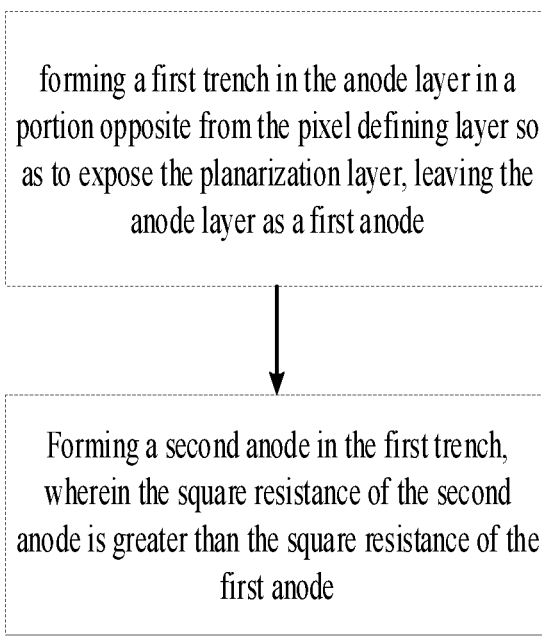
FIG. 3 illustrates an exemplary flow chart of an alternative manufacturing method of anodes according to some embodiments of the present disclosure.

Further, as illustrated in FIG. 2G, the method can include the step of:

forming cathodes 9 over the organic functional layer 8 so as to form a complete anode structure 50 forming part of the OLED display substrate.

In some embodiments, for each pixel region 54, in the region of the anode layer 4 that is proximal to the side of the organic functional layer 8, the sheet resistance of the portion of the anode layer 4 that is proximal to the pixel defining layer 7 can be smaller than the sheet resistance of the portion of the anode layer 4 that is opposite from the pixel defining layer 7, wherein, the abovementioned region is a region of the anode layer in horizontal direction, e.g., the direction that is parallel to the base substrate 1; similarly, the abovementioned portion is a portion of the anode layer 4 in vertical direction, e.g., the direction that is perpendicular to the base substrate 1.

Further, in implementations, the sheet resistance of the second anode 6 can provided such that it is larger than the sheet resistance of the first anode 5, as such, the strength of the electric current flowing through the second anode 6 will then be smaller than the strength of the electric current flowing through the first anode 5. Due to the variation in electric current, the brightness level of the region inside a pixel corresponding to a second anode 6 is lower than the brightness level of the region inside a pixel corresponding to a first anode 5. Further, the sheet resistances of the anodes can then be configured such that they can be adjusted in various corresponding regions of a pixel, then by adjusting the sheet resistances of the anodes the problem of nonuniform brightness level caused by nonuniform film formed inside a pixel region 54 can be effectively solved, thus leading to an improvement and uniformity of the display effects associated therewith.

According to the abovementioned steps, an OLED display substrate 50 as shown in FIG. 2G is formed, including: a base substrate 1; TFT structures 2 provided over the base substrate 1; a planarization layer 3 provided over the TFT structures 2; a pixel defining layer and anodes provided over the planarization layer 3; an organic functional layer 8 provided over the anodes; and cathodes 9 provided over the organic functional layer 8; for each pixel region 54, the anodes include: a first anode 5 surrounded by the pixel defining layer; a first groove 13 that passes through the portion of the first anode 5 that is opposite from the pixel defining layer; a second anode 6 provided inside the first groove; wherein, the sheet resistance of the second anode 6 is larger than the sheet resistance of the first anode 5.

Wherein, for each pixel region 54, the second anode 6 is the portion of the anode that is opposite from the pixel defining layer in the region that is proximal to the side of the organic functional layer 8, the first anode 5 is the portion of the anode that is proximal to the pixel defining layer. The sheet resistance of a second anode 6 is larger than the sheet resistance of a first anode 5.

However, in the abovementioned embodiments, the second anodes 6 are directly in contact with the planarization layer 3, which is necessary due to the sheet resistances of the second anodes 6 being relatively large, as well as the sheet resistance of the anode layer 4 that includes the first anodes 5 and the second anodes 6 being relatively large. These large sheet resistances will then influence the electric contact of drain electrodes 21 between the TFT structures 2 and the anode layer 4 through the electrical contacts 31.

In order to reduce the need for such large sheet resistances, some other embodiments are provided by the present disclosure as illustrated in FIG. 4A, FIG. 4B, FIG. 4C, FIG. 4D, FIG. 4E, FIG. 4F and FIG. 4G.

Figure 4A:
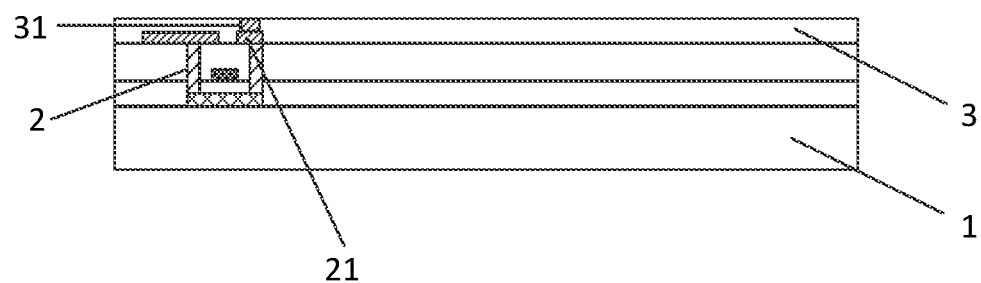
FIG. 4A illustrates an exemplary side cross-sectional view of a first sequential stage of the manufacturing process for creating an anode structure of FIG. 3 according to some other embodiments of the present disclosure.

FIG. 4A is a side cross-sectional view of a first sequential stage of a manufacturing process for creating an alternative OLED display substrate 60 which includes an alternative anode structure according to some other embodiments of the present disclosure.

Figure 4B:
FIG. 4B illustrates an exemplary side cross-sectional view of a second sequential stage of the manufacturing process for creating an anode structure of FIG. 3 according to some other embodiments of the present disclosure.

As shown in FIG. 4A, the method of manufacturing the alternative OLED display substrate can similarly include the steps of: providing an OLED base substrate 1, forming TFT structures 2 over the base substrate 1, forming a planarization layer 3 over the TFT structures 2, wherein, the drain electrodes 21 of the TFT structures 2 are electrically connected to the anode layer 4 through the electrical contacts 31; and as shown in FIG. 4B the method can include, forming an anode layer 4 over the planarization layer 3.

In the region of the anode layer 4 that is proximal to the organic functional layer 8, the sheet resistance of the portion of the anode layer 4 that is proximal to the pixel defining layer can be smaller than the sheet resistance of the portion of the anode layer 4 that is opposite from the pixel defining layer, wherein, the region is a region of the anode layer 4 in the horizontal direction, e.g., the direction that is parallel to the base substrate 1; similarly, the portion is a portion of the anode layer 4 in the vertical direction, e.g., the direction that is perpendicular to the base substrate 1.

FIG. 5 is a flow chart of a manufacturing method of anodes according to some other embodiments of the present disclosure. As illustrated in FIG. 5, the manufacturing method of the anodes specifically can include the following steps.

Figure 4C:
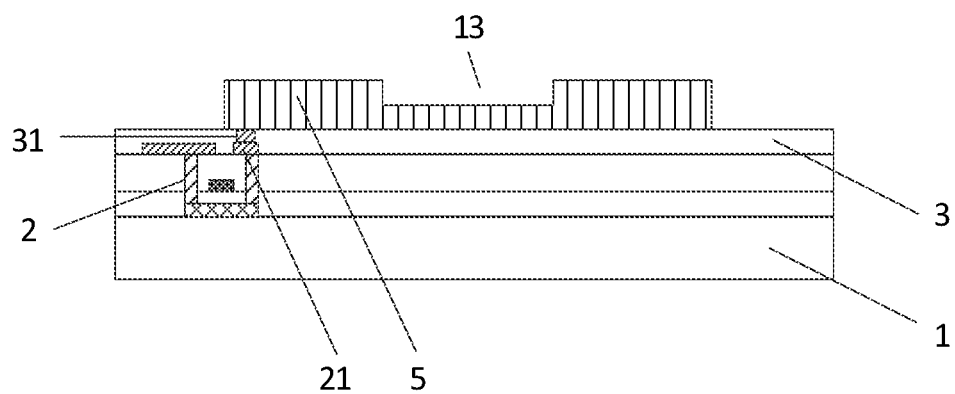
FIG. 4C illustrates an exemplary side cross-sectional view of a third sequential stage of the manufacturing process for creating an anode structure as illustrated in the flow chart of FIG. 5 according to some other embodiments of the present disclosure.

As shown in FIG. 4C, wherein for each pixel region 54, forming a second groove in the region of the anode layer 4 that is opposite from the pixel defining layer, the depth of the second groove can be smaller than the thickness of the anode layer 4, the remaining plateau portions of the anode layer 4 which remain then define a plurality of first anodes 5. In particular, in this case, the first anodes 5 are formed through a patterning process.

Figure 4D:
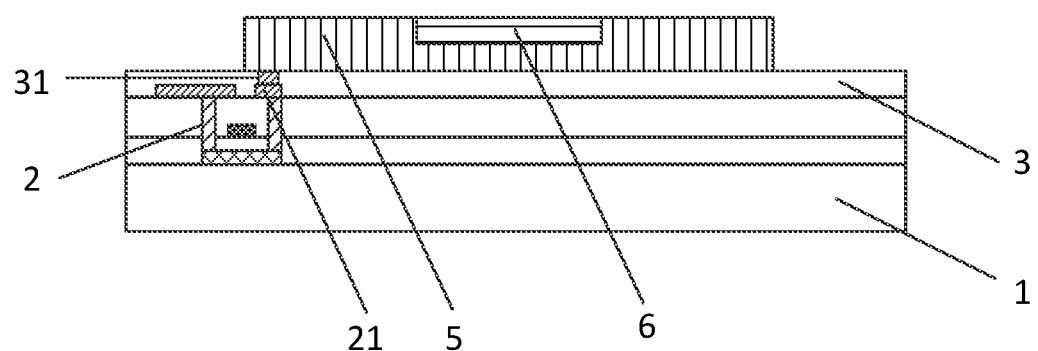
FIG. 4D illustrates an exemplary side cross-sectional view of a fourth sequential stage of manufacturing process for creating an anode structure as illustrated in the flow chart of FIG. 5 according to some other embodiments of the present disclosure.

FIG. 4D is a side cross-sectional view of a fourth sequential stage of manufacturing process for creating an anode structure according to some other embodiments of the present disclosure. As shown in FIG. 4D, for each pixel region 54, the method can include a step of: forming a second anode 6 in the second groove.

Figure 4E:
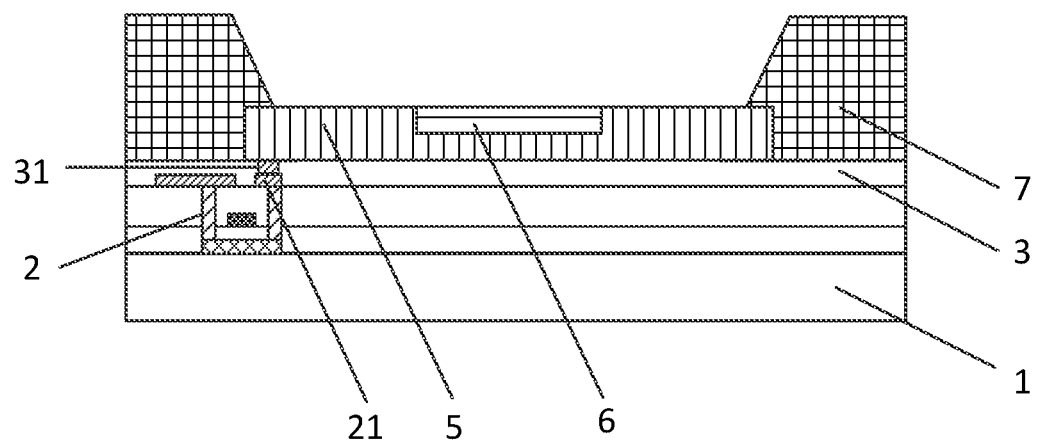
FIG. 4E illustrates an exemplary side cross-sectional view of a fifth sequential stage of the manufacturing process for creating an anode structure as illustrated in the flow chart of FIG. 5 according to some other embodiments of the present disclosure.

FIG. 4E is a side cross-sectional view of a fifth sequential stage of manufacturing process for creating an anode structure according to some other embodiments of the present disclosure. As shown in FIG. 4E, forming a pixel defining layer 7 that surrounds the anode layer 4.

Figure 4F:
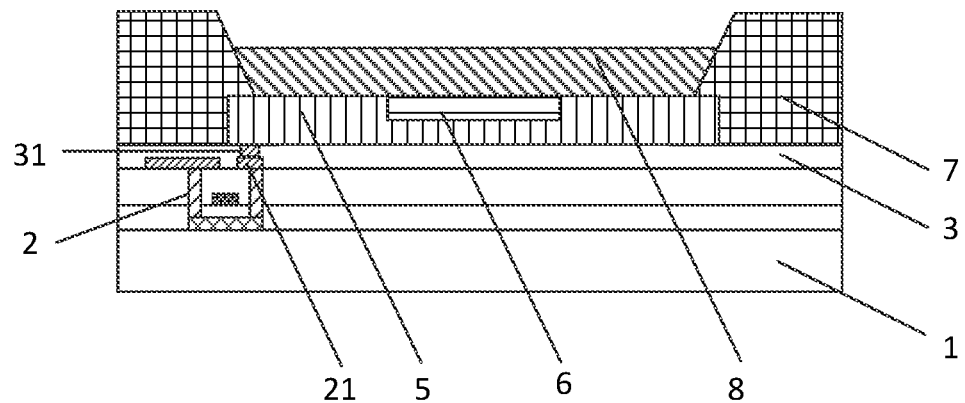
FIG. 4F illustrates an exemplary side cross-sectional view of a sixth sequential stage of the manufacturing process for creating an anode structure as illustrated in the flow chart FIG. 5 according to some other embodiments of the present disclosure.

FIG. 4F is a side cross-sectional view of a sixth sequential stage of manufacturing process for creating an anode structure according to some other embodiments of the present disclosure. As shown in FIG. 4F, forming an organic functional layer 8 over the anode layer 4, or in this case over the remaining first anodes 5.

Figure 4G:
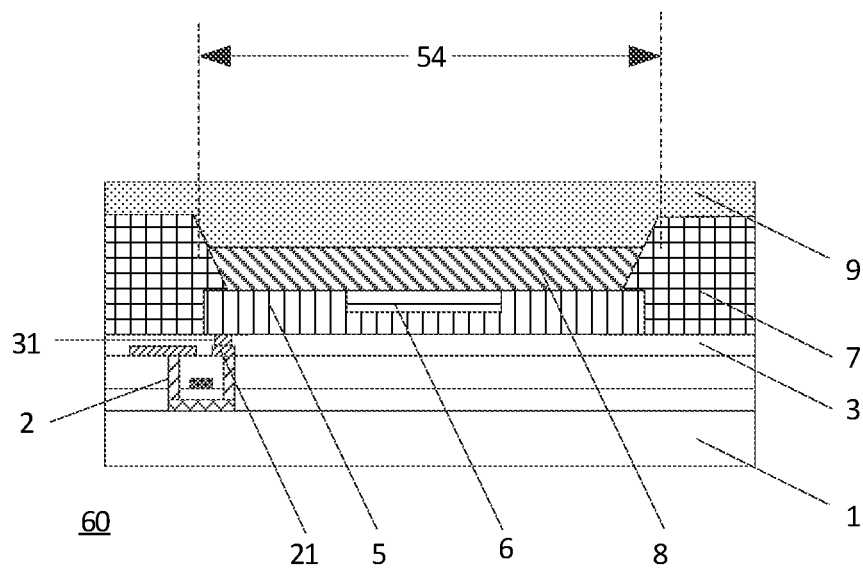
FIG. 4G illustrates an exemplary side cross-sectional view of a seventh sequential stage of the manufacturing process for creating an anode structure as illustrated in the flow chart FIG. 5 according to some other embodiments of the present disclosure.

Further, as illustrated in a side cross-sectional view in FIG. 4G, a seventh sequential stage of manufacturing process for creating an anode structure according to some other embodiments of the present disclosure can include forming cathodes 9 over the organic functional layer 8.

According to the abovementioned steps, an OLED display substrate 60 as illustrated in FIG. 4G is formed, including: a base substrate 1; TFT structures 2 provided over the base substrate 1; a planarization layer 3 provided over the TFT structures 2; a pixel defining layer and anodes provided over the planarization layer 3; an organic functional layer 8 provided over the anodes; and cathodes 9 provided over the organic functional layer 8; for each pixel region 54, the anodes include a first anode 5 surrounded by the pixel defining layer; a second groove provided at the portion of the first anode 5 that is opposite from the pixel defining layer, the depth of the second groove can be smaller than the thickness of the first anode 5; a second anode 6 provided in the second groove, wherein, the sheet resistance of a second anode 6 can be larger than the sheet resistance of a first anode 5.

Wherein, for each pixel region 54, the second anode 6 is the portion of the anode layer 4 that is opposite from the pixel defining layer 7 in the region that is proximal to the organic functional layer 8, the first anode 5 is the portion of the anode layer 4 that is proximal to the pixel defining layer 7. The sheet resistance of a second anode 6 can then be provided which is larger than the sheet resistance of a first anode 5.

Similarly to the embodiment discussed above with reference to the embodiments illustrated in FIG. 2A, FIG. 2B, FIG. 2C, FIG. 2D, FIG. 2E and FIG. 2F, by adjusting the sheet resistance of the first anode 5 and the sheet resistance of the second anode 6 corresponding to different regions of a pixel, the problem of nonuniform brightness level in a pixel region 54 caused by the nonuniform film formed in a pixel region 54 can be effectively solved, an a corresponding display effect can thus be substantially improved.

In order to further improve the electric contact between the drain electrodes 21 of the TFT structures 2 and the anode layer 4 through the electrical contacts 31 and reduce the overall sheet resistance of the anode layer 4, as illustrated in FIG. 6A, FIG. 6B, FIG. 6C, FIG. 6D, FIG. 6E, FIG. 6F, FIG. 6G and FIG. 6H, additional other embodiments are provided by the present disclosure, e.g., as illustrated, which can provide yet another exemplary OLED display substrate 70 which can include third anodes 10 provided above the second anodes 6, wherein the third anodes 10 can be provided having relatively low sheet resistances.

Figure 6A:
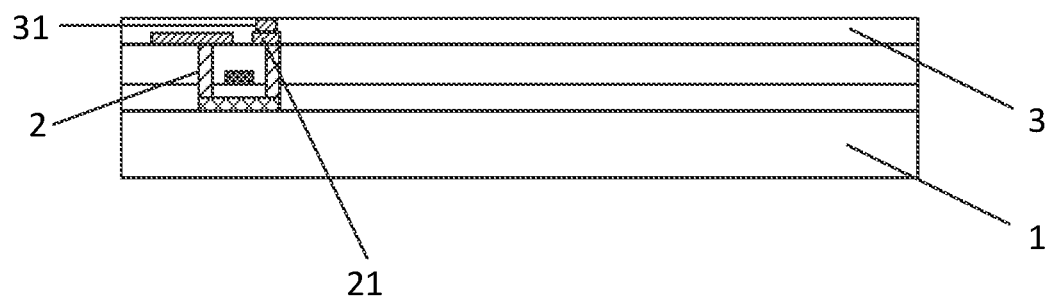
FIG. 6A illustrates an exemplary side cross-sectional view of a first sequential stage of the manufacturing process for creating an anode structure as illustrated in the flow chart of FIG. 7 according to additional other embodiments of the present disclosure.
Figure 6B:
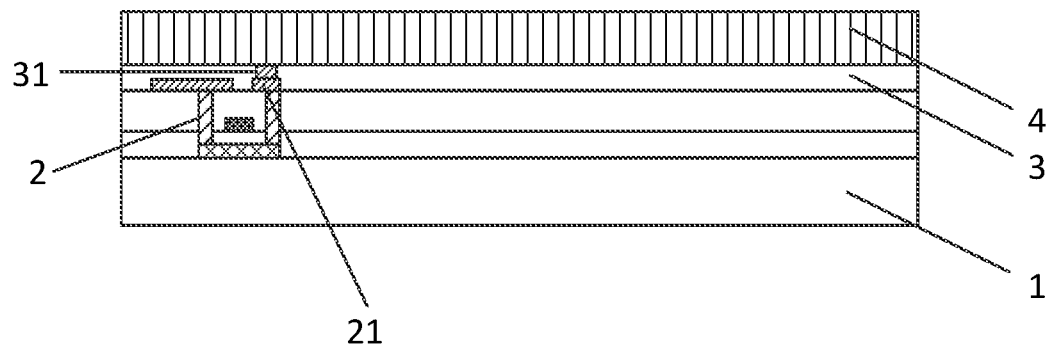
FIG. 6B illustrates an exemplary side cross-sectional view of a second sequential stage of the manufacturing process for creating an anode structure as illustrated in the flow chart of FIG. 7 according to additional other embodiments of the present disclosure.

It will be further appreciated that the TFT structures 2 are provided within semiconductor and dielectric layers 23 and 25 wherein the base substrate 1 can be a nonconductive substrate such as glass. The semiconductor layer can be provided as silicon, amorphous silicon, microcrystalline silicone, annealed polysilicon, cadmium selenide, metal oxides such as zinc oxide, hafnium oxide, indium tin oxide, etc. or these layers can also be formed using various organic materials With particular reference to, FIG. 6A is a side cross-sectional view of a first sequential stage of manufacturing process for creating an anode structure according to additional other embodiments of the present disclosure. As shown in FIG. 6A, providing an OLED base substrate 1, forming TFT structures 2 over the base substrate 1, and forming a planarization layer 3 over the TFT structures 2, wherein, the drain electrodes 21 of the TFT structures 2 are electrically connected to the anode layer 4 through the electrical contacts 31. Then, manufacturing an anode layer 4, which differs from the aforementioned methods is contemplated herein, where the process still includes a step of forming an anode layer 4 over the planarization layer 3.

However, in particular, within the region of the anode layer 4 that is proximal or adjacent to the organic functional layer 8 can be formed in such a manner that the sheet resistance of the portion of the anode layer 4 that is proximal to the pixel defining layer can be smaller than the sheet resistance of the portion of the anode layer 4 that is opposite from the pixel defining layer 7, wherein, the region is a region of the anode layer 4 in a horizontal direction, in which the region is substantially parallel to the base substrate 1; similarly, the various portions having varying sheet resistances are defined as portions of the anode layer extending in a vertical direction, e.g., the direction that is perpendicular to the base substrate 1.

Figure 6C:
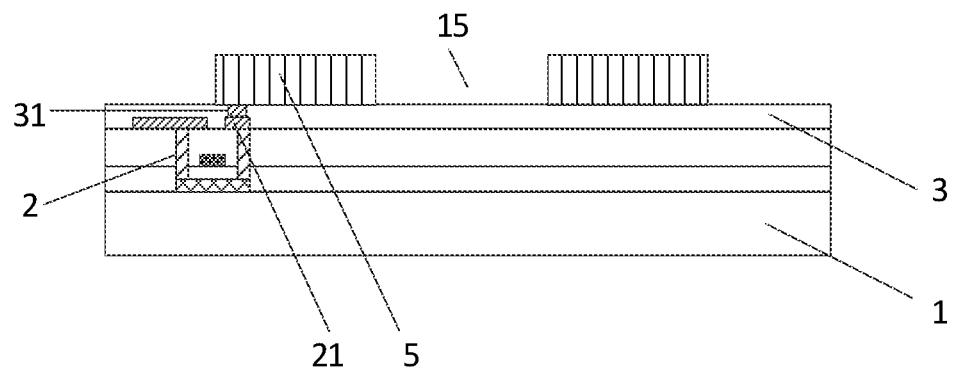
FIG. 6C illustrates an exemplary side cross-sectional view of a third sequential stage of the manufacturing process for creating an anode structure as illustrated in the flow chart of FIG. 7 according to additional other embodiments of the present disclosure.
Figure 6D:
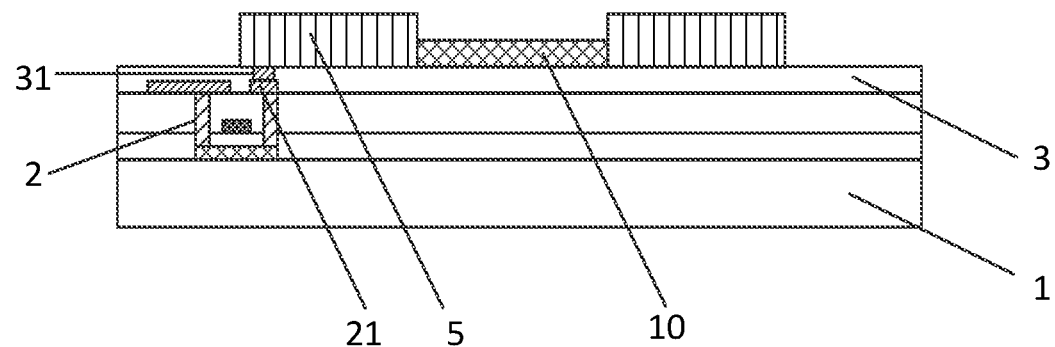
FIG. 6D illustrates an exemplary side cross-sectional view of a fourth sequential stage of the manufacturing process for creating an anode structure as illustrated in the flow chart of FIG. 7 according to additional other embodiments of the present disclosure.
Figure 7:
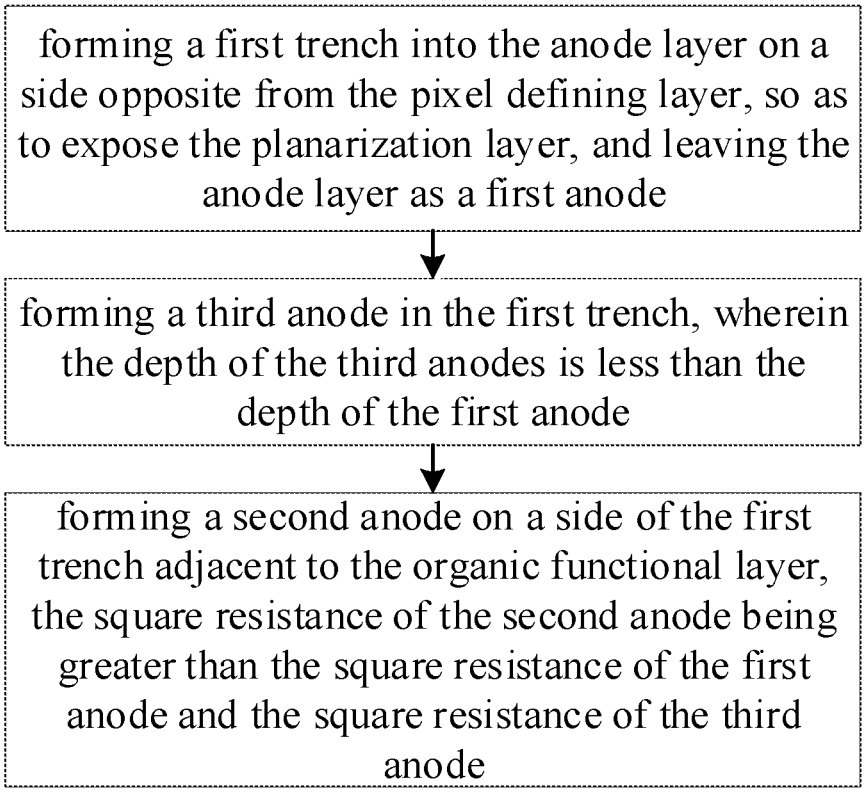
FIG. 7 illustrates yet another flow chart of another alternative manufacturing method of anodes according to yet more additional embodiments of the present disclosure.

As illustrated in FIG. 7, the manufacturing method of the anodes specifically can then include the steps of: as illustrated in FIG. 6C for each pixel region 54, a step of forming a first groove 15 that passes through the anode layer 4 at the region of the anode layer 4 that is opposite from the pixel defining layer such that the planarization layer 3 is exposed, thus separating a plurality of portions of the anode layer 4, wherein the remaining portions of the anode layer 4 then define a plurality of a first anodes 5;

FIG. 6D is a side cross-sectional view of a fourth sequential stage of manufacturing process for creating an anode structure according to additional other embodiments of the present disclosure. As shown in FIG. 6D, for each pixel region 54, the method then includes a step of forming a third anode 10 in the first groove, wherein the thicknesses of the third anode 10 can be smaller than the thicknesses of the first anode 5, such that a second anode 6 can be formed over the third anode 10 but remain flush with an upper surface of the first anode 5.

Figure 6E:
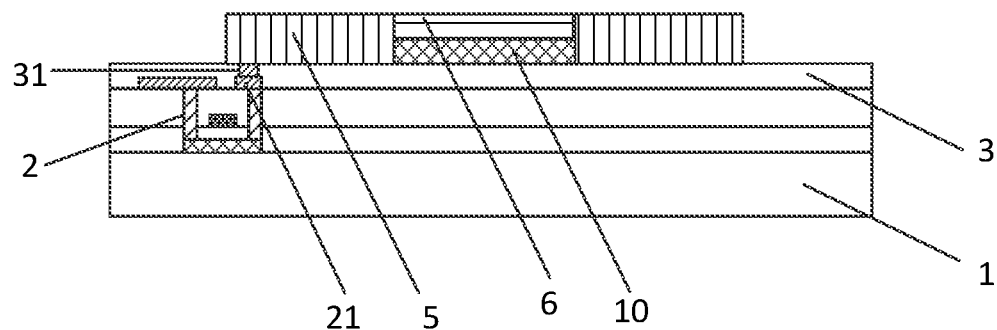
FIG. 6E illustrates an exemplary side cross-sectional view of a fifth sequential stage of the manufacturing process for creating an anode structure as illustrated in the flow chart of FIG. 7 according to additional other embodiments of the present disclosure.

FIG. 6E is a side cross-sectional view of a fifth sequential stage of manufacturing process for creating an anode structure according to additional other embodiments of the present disclosure.

As shown in FIG. 6E, for each pixel region 54, forming a second anode 6 in the first groove at the side of the third anode 10 that is proximal to the organic functional layer 8, wherein, the sheet resistance of the second anode 6 can be larger than the sheet resistance of the first anode 5 and the third anode 10. Similar to the embodiments described above, for each pixel region 54, through adjusting the sheet resistance of the first anode 5, the sheet resistance of the second anode 6 and the sheet resistance of the third anode 10 corresponding to different regions of the a pixel, the problem of nonuniform brightness level in a pixel region 54 caused by nonuniform film formed in a pixel region 54 is solved, meanwhile, electrical connections between the drain electrodes 21 of the TFT structures 2 and the anode layer 4 through the electrical contacts 31 are improved, the overall sheet resistance of the anode layer 4 is reduced, and the display effect is effectively improved.

For example, in some embodiments the sheet resistance of the first anode can be in the range of 20-100Ω, wherein the sheet resistance of the second anode can be 50-500Ω, while the sheet resistance of the third anode can then be between 10-100Ω.

Figure 6F:
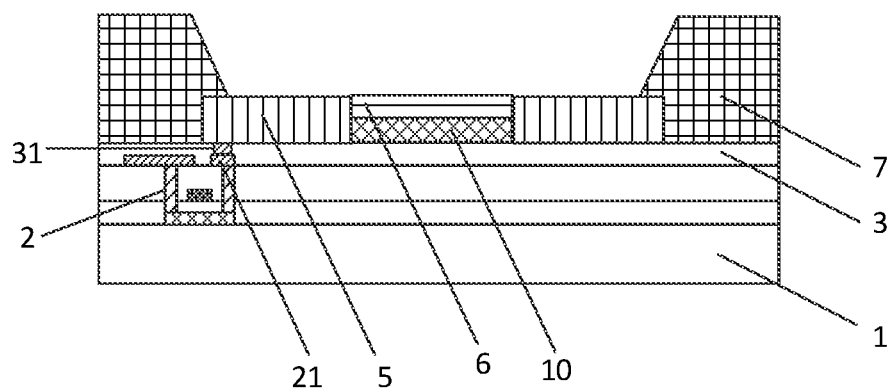
FIG. 6F illustrates an exemplary side cross-sectional view of a sixth sequential stage of the manufacturing process for creating an anode structure as illustrated in the flow chart of FIG. 7 according to additional other embodiments of the present disclosure.

FIG. 6F is a side cross-sectional view of a sixth sequential stage of manufacturing process for creating an anode structure according to additional other embodiments of the present disclosure. As shown in FIG. 6F, the step can include forming a pixel defining layer 7 that surrounds the anode layer 4.

Figure 6G:
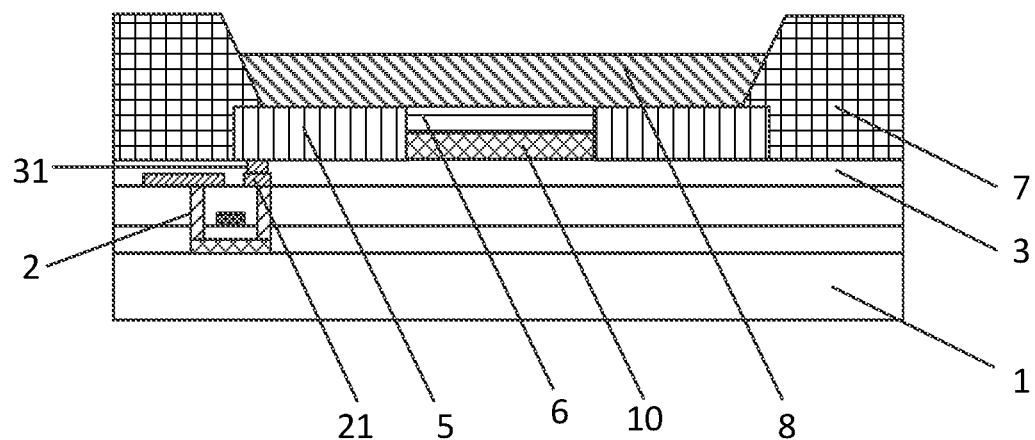
FIG. 6G illustrates an exemplary side cross-sectional view of a seventh sequential stage of the manufacturing process for creating an anode structure as illustrated in the flow chart of FIG. 7 according to additional other embodiments of the present disclosure.

As illustrated in FIG. 6G, the method can include a step of forming an organic functional layer 8 over the anode layer 4.

Figure 6H:
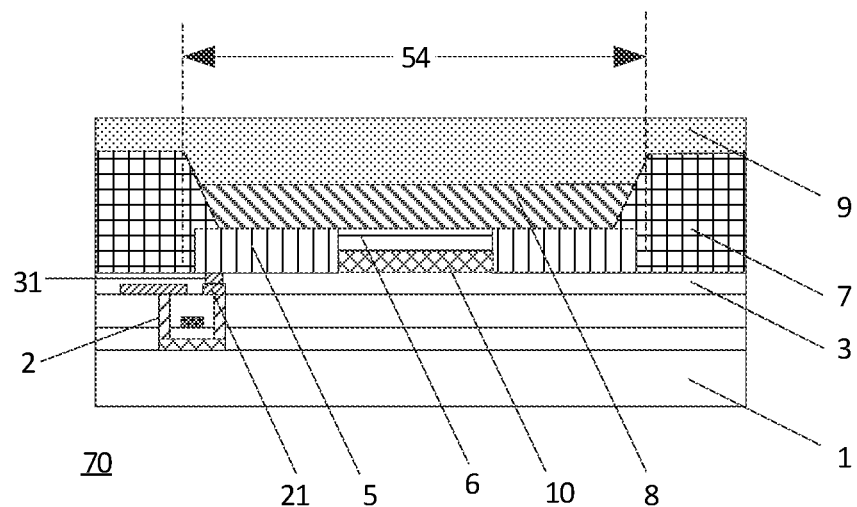
FIG. 6H illustrates an exemplary side cross-sectional view of an eighth sequential stage of the manufacturing process for creating an anode structure as illustrated in the flow chart of FIG. 7 according to additional other embodiments of the present disclosure.

Further, as illustrated in FIG. 6H, the method can include a step of forming cathodes 9 over the organic functional layer 8.

According to the abovementioned steps, an OLED display substrate 70 as illustrated in FIG. 6H is formed, including: a base substrate 1; TFT structures 2 provided over the base substrate 1; a planarization layer 3 provided over the TFT structures 2; a pixel defining layer and anodes provided over the planarization layer 3; an organic functional layer 8 provided over the anodes; and cathodes 9 provided over the organic functional layer 8; for each pixel region 54, the anodes include a first anode 5 surrounded by the pixel defining layer; a first groove that passes through the portion of the first anode 5 that is opposite from the pixel defining layer; a third anode provided in the first groove, the thickness of the third anode can be smaller than the thickness of the first anode 5; a second anode 6 provided inside the first groove, the second anode 6 is located at the side of the third anode proximal to the organic functional layer 8; wherein, the sheet resistance of a second anode 6 is larger than the sheet resistance of a first anode 5 and the sheet resistances of a third anode.

Wherein, for each pixel region 54, the second anode 6 is the portion of the anodes that is opposite from the pixel defining layer in the region of the anode layer 4 that is proximal to the organic functional layer 8, the first anode 5 is the portion of the anodes in the region of the anode layer 4 that is proximal to the pixel defining layer. The sheet resistance of a second anode 6 is larger than the sheet resistance of a first anode 5.

In some embodiments, for each pixel region 54, the sheet resistance of a second anode 6 is greater than the sheet resistance of a first anode 5, and the sheet resistance of the first anode 5 is greater than the sheet resistance of a third anode 10.

In other words, the sheet resistance of a second anode 6 is the largest, according to the light emission principles of OLED components, the electric current flowing through a second anode 6 is the smallest, therefore, the brightness level of the portion of a pixel located over a second anode 6 is the lowest, therefore, the problem of nonuniform brightness level caused by the fact that the in-pixel film is thinner in the central region and thicker at the periphery region can be reduced, therefore, the problem of nonuniform light emission in a pixel region 54 can be solved; meanwhile, electric contact between the drain electrodes 21 of the TFT structures 2 and the anode layer 4 through the electrical contacts 31 is improved, the overall sheet resistance of the anode layer 4 is reduced, the display effect is effectively improved.

In another aspect of the present disclosure, according to the descriptions in the abovementioned embodiments of the present disclosure, persons skilled in the art can understand, the following anode structures is also within the range of protection of the present disclosure; an OLED display substrate, including: a base substrate 1; TFT structures 2 provided over the base substrate 1; a planarization layer 3 provided over the TFT structures 2; a pixel defining layer and anodes provided over the planarization layer 3; an organic functional layer 8 provided over the anodes; and cathodes 9 provided over the organic functional layer 8; wherein, in the region of the anode layer 4 that is proximal to or adjacent to the organic functional layer 8, the sheet resistance of the portion of the anodes that is proximal to or adjacent the pixel defining layer can be smaller than the sheet resistance of the portion of the anodes that is opposite from the pixel defining layer.

In some embodiments, the material of the first anode 5, second anode 6, and third anode 10 can be aluminum zinc oxide (AZO), Indium zinc oxide (IZO), indium tin oxide (ITO) or zinc oxide (ZnO) or any combination thereof. The first anode 5, the second anode 6, and the third anode 10 can be made of different material, they can also be made of same material, however, the oxygen content of each anode should be different, generally, the higher the oxygen content, the larger the sheet resistance. In other words, even when the first anode 5, the second anode 6, and the third anode 10 are made of the same material, if the oxygen contents of the anodes are different, the sheet resistances of the anodes will be different.

Those of ordinary skill in the art will understand, in practical applications, they can be designed according to practical needs, as long as the design principle that the sheet resistance of a second anode 6 is larger than the sheet resistance of a first anode 4 and the sheet resistance of a third anode 10 is satisfied.

Figure 8A:
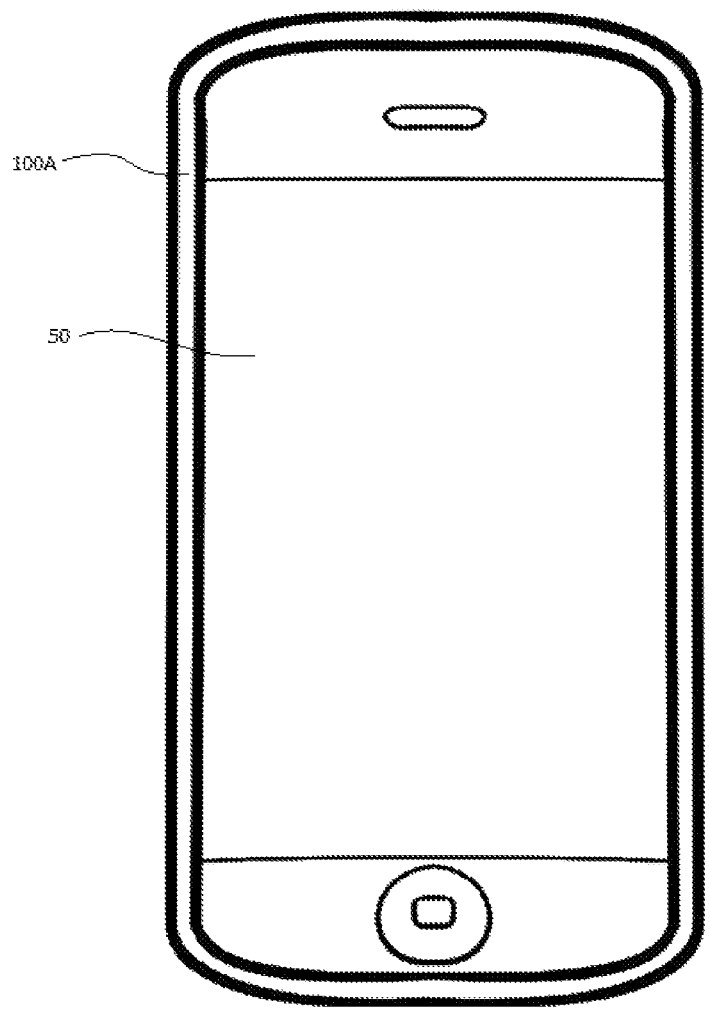
FIG. 8A illustrates a perspective view of a smart phone, being illustrative of exemplary display devices configured to incorporate the various OLED display panels as contemplated herein
Figure 8B:
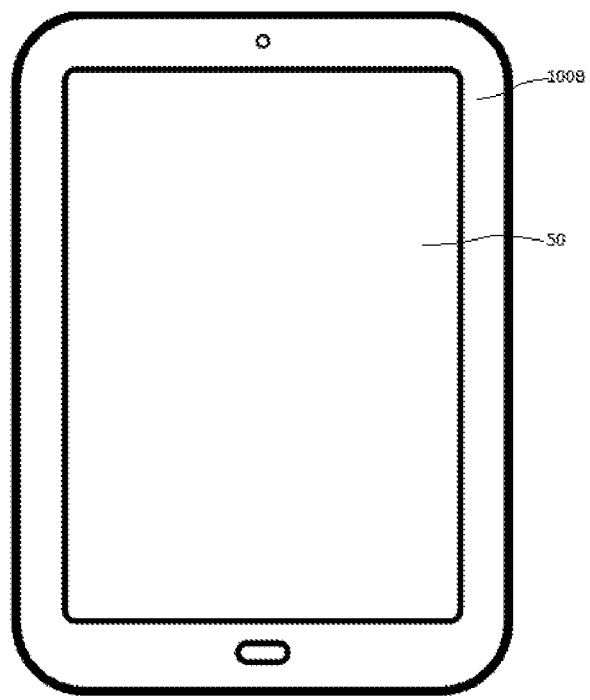
FIG. 8B illustrates a perspective views of a tablet, being illustrative of exemplary display devices configured to incorporate the various OLED display panels as contemplated herein.
Figure 8C:
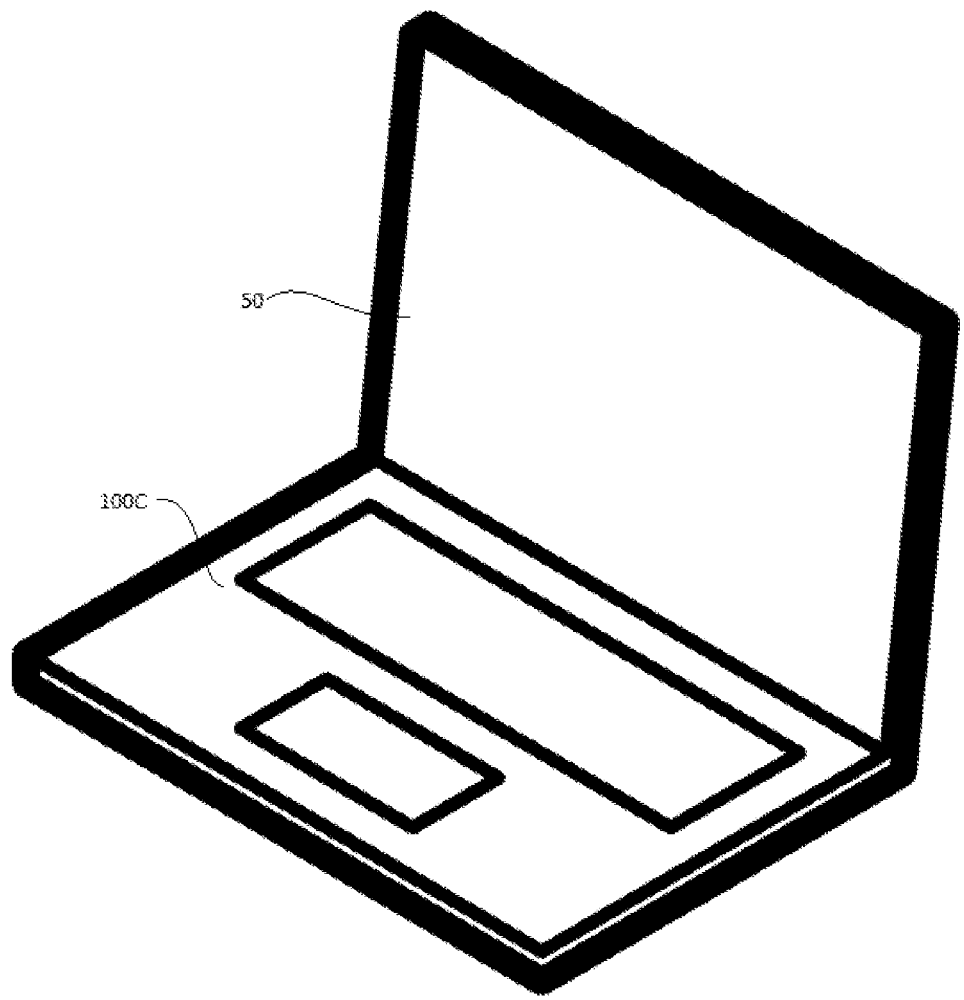
FIG. 8C illustrates a perspective views of a laptop, being illustrative of exemplary display devices configured to incorporate the various OLED display panels as contemplated herein.

In another aspect of the present disclosure, and as shown in FIGS. 8A-8C, a display device is provided, including the aforementioned OLED display substrate. The display devices of the present disclosure may be any products or components that have a display function, for example, OLED display panels, which can be utilized in display devices such as mobile phones 100A as illustrated in FIG. 8A, tablets 100B as illustrated in FIG. 8B, laptops 100C as illustrated in FIG. 8C, or other devices having displays or monitors, digital frames, or navigators.

Figure 9A:
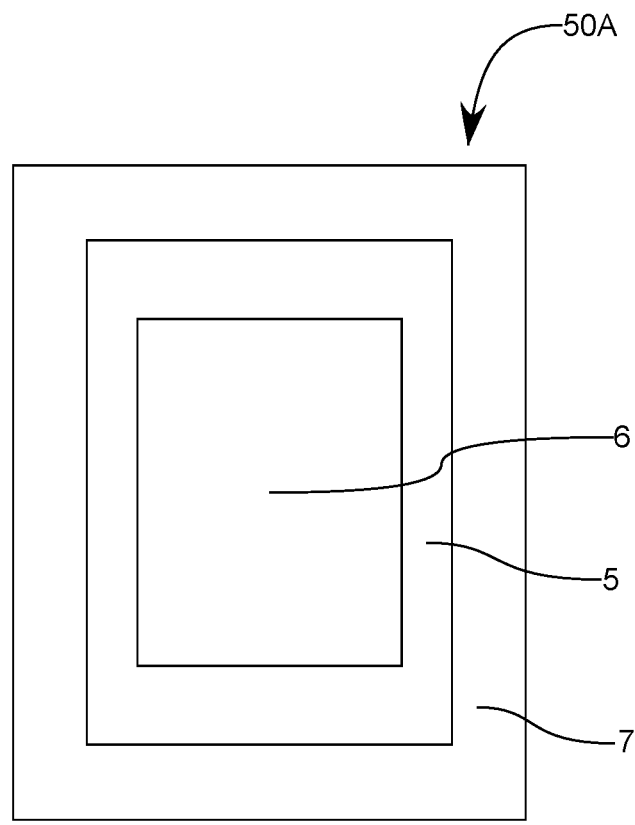
FIG. 9A illustrates a top view of a first arrangement of an exemplary anode structure in accordance with various aspects of the present disclosure.
Figure 9B:
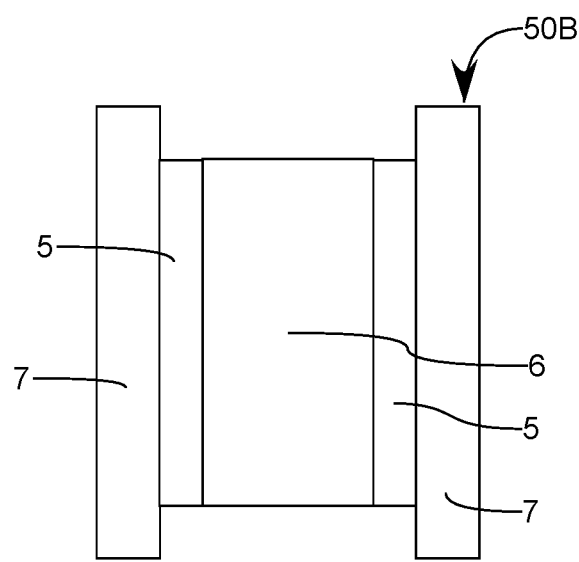
FIG. 9B illustrates a top view of a second arrangement of an exemplary anode structure in accordance with various aspects of the present disclosure.

As illustrated in FIGS. 9A-9B, illustrated are two potential arrangements of the anodes, as illustrated in top views of the various individual pixels of the OLED display panels 50A and 50B respectively.

As illustrated particularly in FIG. 9A, in some embodiments, the first anode 5 can be formed about a circumferential portion of the second anode 6 such that the first anode 5 encompasses the second anode 6, or forms a ring therearound. Also as illustrated herein the pixel defining layer 7 can then be provided around the first anode 5 such as to encompass the first anode entirely. While this structure is illustrated as rectangular, the circumferential portion can be virtually any geometric shape wherein the first anode 5 can be annular in shape etc., so as to encompass the second anode 6.

In contrast, as illustrated in FIG. 9B, the first anode 5 can be provided as opposing bars which can be located at opposing edges of the second anode 6, wherein the pixel defining layer 7 can be provided at distal edges thereof. In should be appreciated that virtually any arrangement where the second anode is located within or between the first anode components are contemplated herein and these arrangements are made for purposes of example only.

At least some embodiments of the present disclosure can have one or more of the following advantages. For example, by utilizing the methods and systems of the present disclosure, the problem of nonuniform display brightness level caused by the nonuniform film formed in a pixel region in existing technologies can be mitigated or solved.

Further, various embodiments of the present disclosure provide an OLED display panel, wherein the hole injection can be adjusted by means of changing the resistance values of the anodes at different positions so as to compensate the display brightness level inside the pixel region, it can then reduce nonuniform in-pixel light emission, as a result, the display effects of the display panel can be improved.

Therefore, in order to improve the light emission uniformity inside a pixel and reduce the difference in brightness level between the periphery region of a pixel and the components inside a pixel, anode structures with different sheet resistance are provided by embodiments of present disclosure, different sheet resistance values can be provided for different anode structures to adjust hole injection, as a result, in-pixel light emission uniformity can be achieved, the display effect of the display panel can be effectively improved.

Various embodiments in this specification have been described in a progressive manner, where descriptions of some embodiments focus on the differences from other embodiments, and same or similar parts among the different embodiments are sometimes described together in only one embodiment.

It should also be noted that in the present disclosure, relational terms such as first and second, etc., are only used to distinguish one entity or operation from another entity or operation, and do not necessarily require or imply these entities having such an order or sequence. It does not necessarily require or imply that any such actual relationship or order exists between these entities or operations.

Moreover, the terms "include," "including," or any other variations thereof are intended to cover a non-exclusive inclusion such that a process, method, article, or apparatus that comprises a list of elements including not only those elements but also those that are not explicitly listed, or other elements that are inherent to such processes, methods, goods, or equipment.

In the case of no more limitation, the element defined by the sentence "includes a . . . " does not exclude the existence of another identical element in the process, the method, the commodity, or the device including the element.

The foregoing has provided a detailed description on a display substrate, a display panel and a display device according to some embodiments of the present disclosure. Specific examples are used herein to describe the principles and implementations of some embodiments. The description is only used to help understanding some of the possible methods and concepts. Meanwhile, those of ordinary skill in the art may change the specific implementation manners and the application scope according to the concepts of the present disclosure. The contents of this specification therefore should not be construed as limiting the disclosure.

In the descriptions, with respect to unit(s), device(s), component(s), etc., in some occurrences singular forms are used, and in some other occurrences plural forms are used in the descriptions of various embodiments. It should be noted; however, the single or plural forms are not limiting but rather are for illustrative purposes. Unless it is expressly stated that a single unit, device, or component etc. is employed, or it is expressly stated that a plurality of units, devices or components, etc. are employed, the unit(s), device(s), component(s), etc. can be singular, or plural.

Based on various embodiments of the present disclosure, the disclosed apparatuses, devices, and methods may be implemented in other manners. For example, the abovementioned display substrates, display panels and display devices are only of illustrative purposes, and other types of display substrates, display panels and display devices can employ the methods disclosed herein.

Dividing the device into different "regions," "units," or "layers," etc. merely reflect various logical functions according to some embodiments, and actual implementations can have other divisions of "regions," "units," or "layers," etc. realizing similar functions as described above, or without divisions. For example, multiple regions, units, or layers, etc. may be combined or can be integrated into another system. In addition, some features can be omitted, and some steps in the methods can be skipped.

Those of ordinary skill in the art will appreciate that the units, regions, or layers, etc. in the devices provided by various embodiments described above can be provided in the one or more devices described above. They can also be located in one or multiple devices that is (are) different from the example embodiments described above or illustrated in the accompanying drawings. For example, the units, regions, or layers, etc. in various embodiments described above can be integrated into one module or divided into several sub-modules.

The order of the various embodiments described above are only for the purpose of illustration, and do not represent preference of embodiments.

Although specific embodiments have been described above in detail, the description is merely for purposes of illustration. It should be appreciated, therefore, that many aspects described above are not intended as required or essential elements unless explicitly stated otherwise.

Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation to encompass such modifications and equivalent structures.

The invention claimed is:

1. An organic light-emitting diode (OLED) display substrate comprising:
   a base substrate;
   one or more thin-film transistor (TFT) structures provided over the base substrate;
   a planarization layer provided over the TFT structures;
   anodes provided on an upper surface of the planarization layer;
   a pixel defining layer provided over the planarization layer defining a plurality of pixel regions, wherein each anode includes an upper surface being exposed in each of the pixel regions;
   an organic functional layer provided over the anodes; and
   a cathode provided over the organic functional layer;
   wherein a sheet resistance of the portion of the anodes that is proximal to the pixel defining layer is smaller than a sheet resistance of the portion of the anodes that is opposite from the pixel defining layer; and wherein each pixel region further comprises:
- a central region that is proximal to the pixel defining layer and a peripheral region that is opposite from the pixel defining layer;
- a first anode provided in the pixel region;
- a first groove that passes through the portion of the first anode that is in the central region;
- a third anode provided inside the first groove, the thicknesses of the third anode being smaller than the thicknesses of the first anode; and
- a second anode provided inside the first groove, the second anode is located at the side of the third anode that is proximal to the organic functional layer, wherein, the sheet resistance of the second anode is larger than the sheet resistance of the first anode and the sheet resistance of the third anode.

2. The OLED display substrate of claim 1, wherein, each pixel region further comprises:
- a central region that is proximal to the pixel defining layer and a peripheral region that is opposite from the pixel defining layer;
- a first anode provided in the peripheral layer; and
- a second anode provided in the central region, wherein, the sheet resistance of the second anode is larger than the sheet resistance of the first anode.

3. The OLED display substrate of claim 1, wherein each pixel region further comprises:
- a central region that is proximal to the pixel defining layer and a peripheral region that is opposite from the pixel defining layer;
- a first anode provided in the pixel region;
- a second groove provided at the central region of the first anode; wherein the depth of the second groove is smaller than the thickness of the first anode; and
- a second anode provided inside the second groove, wherein, the sheet resistance of the second anode is larger than the sheet resistance of the first anode.

4. The OLED display substrate of claim 1, wherein the sheet resistance of a second anode is greater than the sheet resistance of a first anode which is greater than the sheet resistance of a third anode.

5. The OLED display substrate of claim 1, wherein the first anode is formed about a circumferential portion of the second anode.

6. The OLED display substrate of claim 1, wherein the first anode as bars being provided opposing edges of the second anode.

7. A manufacturing method of an organic light-emitting diode (OLED) display substrate, the method comprising:
- providing a base substrate:
- forming a plurality of thin-film transistor (TFT) structures over the base substrate;
- forming a planarization layer over the TFT structures;
- forming an anode layer having one or more anodes provided therein on the planarization layer;
- forming a pixel defining layer which surrounds the one or more anodes within the anode layer over the planarization layer;
- wherein a sheet resistance of a portion of the anode layer that is adjacent to the pixel defining layer is smaller than a sheet resistance of the portion of the anode layer that is opposite from the pixel defining layer;
- forming an organic functional layer over the anode layer; and
- forming one or more cathodes over the organic functional layer;

wherein each pixel region further comprises a central region that is proximal to the pixel defining layer and a peripheral region that is opposite from the pixel defining layer;

wherein for each pixel region, in a region that is adjacent to the side of the organic functional layer, wherein the sheet resistance of a portion of the anode layer that is adjacent to the pixel defining layer is smaller than the sheet resistance of a portion of the anode layer that is opposite from the pixel defining layer; and wherein the method further comprises:
- forming a first groove that passes through the anode layer in a central region of the anode layer being opposite from the pixel defining layer such that the planarization layer is exposed, wherein the remaining anode layer thus defines a first anode; and
- forming a second anode in the first groove, wherein the sheet resistance of the second anode is larger than the sheet resistance of the first anode.

8. The method of claim 7, wherein each pixel region further comprises a central region that is proximal to the pixel defining layer and a peripheral region that is opposite from the pixel defining layer;

wherein for each pixel region, the anode layer is located in a region that is adjacent to the side of the organic functional layer, wherein the sheet resistance of a portion of the anode layer that is adjacent to the pixel defining layer is smaller than the sheet resistance of a portion of the anode layer that is opposite from the pixel defining layer; and wherein the method further comprises:
- forming a second groove at the region of the anode layer that is opposite from the pixel defining layer, wherein the depth of the second groove is smaller than the thickness of the anode layer, wherein the remaining anode layer is a first anode; and
- forming a second anode in the second groove, wherein the sheet resistance of the second anode is larger than the sheet resistance of the first anode.

9. The method of claim 7, wherein each pixel region further comprises a central region that is proximal to the pixel defining layer and a peripheral region that is opposite from the pixel defining layer;

wherein for each pixel region, the anode layer is located in a region that is adjacent to the side of the organic functional layer;

wherein the sheet resistance of a portion of the anode layer that is proximal to the pixel defining layer is smaller than the sheet resistance of a portion of the anode layer that is opposite from the pixel defining layer; and the method further comprises:
- forming a first groove that passes through the anode layer at the region of the anode layer that is opposite from the pixel defining layer such that the planarization layer is exposed, the remaining anode layer is a first anode;
- forming a third anode in the first groove, the thickness of the third anode is smaller than the thickness of the first anode; and
- forming a second anode in the first groove at the side of the third anode that is proximal to the organic functional layer, wherein the sheet resistance of the second anode is larger than the sheet resistance of the first anode and the sheet resistance of the third anode.

10. The method of claim 9, wherein the sheet resistance of a second anode is greater than the sheet resistance of a first anode; and wherein the sheet resistance of the first anode is greater than the sheet resistance of a third anode.

11. An organic light-emitting diode (OLED) display panel comprising:
a base substrate having an upper surface and a lower surface;
one or more thin-film transistor (TFT) structures provided on the upper surface of the base substrate;
a planarization layer provided over the TFT structures, the planarization layer having an upper surface and a lower surface, the lower surface of the planarization layer facing the upper surface of the base substrate;
a plurality of first anodes provided on the upper surface of the planarization layer;
a groove provided between at least two of the plurality of first anodes;
one or more second anodes provided within the groove;
a pixel defining layer provided over the planarization layer and encompassing an edge portion of the one or more anodes leaving a portion of a top surface of each anode exposed;
an organic functional layer provided over the one or more anodes on the portion of the top surface of each anode exposed from the pixel defining layer; and
one or more cathodes provided over the organic functional layer.

12. The OLED display panel of claim 11, wherein the groove extends a full height of one the plurality of first anodes and exposes the planarization layer below the one of the plurality of first anodes from a top side thereof.

13. The OLED display panel of claim 11, further comprising a third anode also provided within the groove.

14. The OLED display panel of claim 13, wherein a combined thickness of the second anode and the third anode is equal to a thickness of the first anode.

15. The OLED display panel of claim 12, wherein the third anode is below the second anode, and wherein an upper surface of the second anode is flush with an upper surface of the one of the plurality of first anodes.

16. The OLED display panel of claim 11, wherein the groove extends less than a full height of one of the plurality of first anodes, and wherein a portion of material forming the plurality of first anodes completely covers the upper surface of the planarization layer below the plurality of first anodes from a top side thereof.

17. The OLED display panel of claim 16, further comprising a third anode also provided within the groove, wherein an upper surface of the second anode is flush with an upper surface of the one of the plurality of first anodes, the one of the plurality of first anodes is formed about a circumferential portion of the second anode, and the one of the plurality of first anodes is formed at opposing edges of the second anode.

18. An OLED display device, wherein the display device is provided as a smart device, a mobile phone, or a laptop computer, the display device comprising the OLED display panel of claim 1.

* * * * *